US012601971B2

(12) United States Patent
Tsutsumi

(10) Patent No.: US 12,601,971 B2
(45) Date of Patent: Apr. 14, 2026

(54) NEGATIVE PHOTOSENSITIVE RESIN COMPOSITION

(71) Applicant: ZEON CORPORATION, Tokyo (JP)

(72) Inventor: Takashi Tsutsumi, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 540 days.

(21) Appl. No.: 18/044,082

(22) PCT Filed: Sep. 13, 2021

(86) PCT No.: PCT/JP2021/033611

§ 371 (c)(1),
(2) Date: Mar. 6, 2023

(87) PCT Pub. No.: WO2022/070871

PCT Pub. Date: Apr. 7, 2022

(65) Prior Publication Data

US 2023/0305397 A1 Sep. 28, 2023

(30) Foreign Application Priority Data

Sep. 29, 2020 (JP) ................................. 2020-164168

(51) Int. Cl.
*G03F 7/038* (2006.01)
*G03F 7/004* (2006.01)

(52) U.S. Cl.
CPC ............ *G03F 7/038* (2013.01); *G03F 7/0045* (2013.01)

(58) Field of Classification Search
None
See application file for complete search history.

(56) References Cited

U.S. PATENT DOCUMENTS 6,727,032 B1 * 4/2004 Suwa .................... G03F 7/0395 430/905
2016/0214966 A1 * 7/2016 Kunimoto ............... G03F 7/033
2017/0186874 A1 * 6/2017 Goto .................. H10D 30/6755

FOREIGN PATENT DOCUMENTS

JP 2006139284 A * 6/2006
JP 2006156821 A 6/2006
JP 2008026600 A * 2/2008
JP 2011154264 A * 8/2011
WO WO-2020072776 A1 * 4/2020 ............. C08G 61/08

OTHER PUBLICATIONS

Rvind Kumar et al; Photopatterned electrochromic conjugated polymer films via precursor approach, Polymer vol. 49, 2008 (Year: 2008).*
Translated Description of Hatakeyama (Year: 2008).*
Translated Description of Nishikawa (Year: 2011).*
Translated Description of Suwa (Year: 2006).*
Kumar et al (Photopatterned electrochromic conjugated polymer films via precursor approach, Polymer, 49, 2008, pp. 3686-3892) (Year: 2008).*
Mar. 28, 2023, International Preliminary Report on Patentability issued in the International Patent Application No. PCT/JP2021/033611.

* cited by examiner

*Primary Examiner* — Jonathan Johnson
*Assistant Examiner* — Andrew Preston Traywick
(74) *Attorney, Agent, or Firm* — KENJA IP LAW PC

(57) ABSTRACT

Provided is a negative photosensitive resin composition. The negative photosensitive resin composition contains a polymer and a photo-radical generator. The polymer includes a structural unit (I) represented by formula (I), shown below, and a structural unit (II) represented by formula (II), shown below. In formula (I), $R_1$ to $R_3$ each indicate, independently of one another, a hydrogen atom, an alkyl group, or an aromatic ring group, $R_1$ to $R_3$ may be bonded to form a ring, $R_4$ indicates a hydrogen atom or an alkyl group, X indicates an alkylene group having a carbon number of 1 to 10, and m indicates 0, 1, or 2. In formula (II), $R_5$ to $R_8$ each indicate, independently of one another, a hydrogen atom, an alkyl group, or an aromatic ring group, $R_5$ to $R_8$ may be bonded to form a ring, and n indicates 0, 1, or 2.

(I)

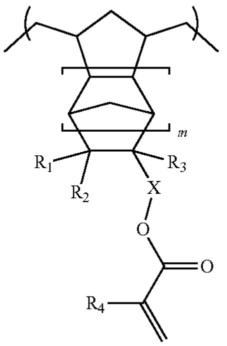

(II)

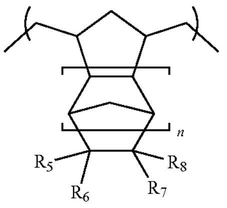

4 Claims, No Drawings

NEGATIVE PHOTOSENSITIVE RESIN COMPOSITION

TECHNICAL FIELD

The present disclosure relates to a negative photosensitive resin composition.

BACKGROUND

Various resin films are included in electronic components such as integrated circuit elements and organic EL elements. Examples of such resin films include protective films for preventing degradation or damage of components themselves, planarizing films for planarizing element surfaces and wiring, electrical insulation films for ensuring electrical insulation, pixel separation films for separating light-emitting parts, and optical films for focusing and diffusing light.

As one example of a conventional photosensitive resin composition that can form a resin film such as described above, Patent Literature (PTL) 1 proposes a resin composition containing a polymerization initiator and a cycloolefin resin that has a functional group including a polymerizable double bond in a side chain.

CITATION LIST

Patent Literature

PTL 1: JP2006-156821A

SUMMARY

Technical Problem

It is desirable for a photosensitive resin composition to have excellent pattern formability by development. It is also desirable for a resin film obtained using a photosensitive resin composition to have excellent electrical characteristics such as dielectric loss tangent and also excellent characteristics such as chemical resistance and extensibility.

However, there is room for improvement of a conventional photosensitive resin composition such as that described in PTL 1 in terms of improving pattern formability by development and also in terms of reducing the dielectric loss tangent of an obtained resin film and improving chemical resistance and extensibility of the resin film.

Accordingly, an object of the present disclosure is to provide a negative photosensitive resin composition that can improve pattern formability by development and that can also reduce the dielectric loss tangent of an obtained resin film and improve chemical resistance and extensibility of the resin film.

Solution to Problem

The inventor conducted diligent studies with the aim of achieving the object set forth above. The inventor discovered that by using a resin composition containing a polymer that includes specific structural units and a photo-radical generator as a negative photosensitive resin composition, it is possible to improve pattern formability by development. The inventor also discovered that by forming a resin film using this resin composition, it is possible to reduce the dielectric loss tangent of the obtained resin film and improve chemical resistance and extensibility of the resin film. The inventor completed the present disclosure based on these findings.

Specifically, the present disclosure aims to advantageously solve the problem set forth above, and a presently disclosed negative photosensitive resin composition comprises a polymer and a photo-radical generator, wherein the polymer includes a structural unit (I) represented by formula (I), shown below, and a structural unit (II) represented by formula (II), shown below.

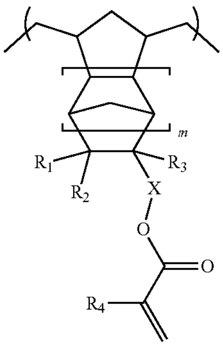

(I)

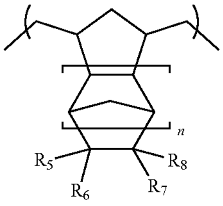

(II)

In formula (I), $R_1$ to $R_3$ each indicate, independently of one another, a hydrogen atom, an alkyl group, or an aromatic ring group, $R_1$ to $R_3$ may be bonded to form a ring, $R_4$ indicates a hydrogen atom or an alkyl group, X indicates an alkylene group having a carbon number of 1 to 10, and m indicates 0, 1, or 2.

In formula (II), $R_5$ to $R_8$ each indicate, independently of one another, a hydrogen atom, an alkyl group, or an aromatic ring group, $R_5$ to $R_8$ may be bonded to form a ring, and n indicates 0, 1, or 2.

Through a negative photosensitive resin composition that contains a polymer including the structural unit (I) and the structural unit (II) and a photo-radical generator in this manner, it is possible to improve pattern formability by development. In addition, the dielectric loss tangent of an obtained resin film can be reduced, and chemical resistance and extensibility of the resin film can be improved.

In the presently disclosed negative photosensitive resin composition, the photo-radical generator is preferably an acylphosphine oxide photo-radical generator or an oxime ester photo-radical generator. By using an acylphosphine oxide photo-radical generator or an oxime ester photo-radical generator as the photo-radical generator, it is possible to further improve pattern formability by development and to further reduce the dielectric loss tangent of an obtained resin film.

In the presently disclosed negative photosensitive resin composition, content of the photo-radical generator is preferably more than 0.5 parts by mass and not more than 25 parts by mass per 100 parts by mass of the polymer. When the content of the photo-radical generator is not less than the lower limit set forth above, even better pattern formability by development can be achieved because a cross-linking reaction of a functional group included in the structural unit of formula (I) can be caused to sufficiently proceed. Moreover, when the content of the photo-radical generator is not more than the upper limit set forth above, the dielectric loss tangent of an obtained resin film can be even further reduced.

In the presently disclosed negative photosensitive resin composition, proportional content of the structural unit (I) in the polymer is preferably not less than 3 mol % and not more than 70 mol %. When the proportional content of the structural unit (I) in the polymer is within the range set forth above, extensibility of an obtained resin film is excellent. Moreover, chemical resistance of a resin film can be improved when the proportional content of the structural unit (I) in the polymer is not less than the lower limit set forth above, whereas an increase of the dielectric loss tangent of a resin film can be suppressed when the proportional content of the structural unit (I) in the polymer is not more than the upper limit set forth above.

Note that the "proportional content of a structural unit" referred to in the present disclosure can be measured by a nuclear magnetic resonance (NMR) method such as $^{1}$H-NMR or $^{13}$C-NMR.

Advantageous Effect

According to the present disclosure, it is possible to provide a negative photosensitive resin composition that can improve pattern formability by development and that can also reduce the dielectric loss tangent of an obtained resin film and improve chemical resistance and extensibility of the resin film.

DETAILED DESCRIPTION

The presently disclosed negative photosensitive resin composition can be used to form a resin film that can be included in an electronic component such as an integrated circuit element, an organic EL element, a semiconductor package, or the like, without any specific limitations. In particular, the presently disclosed negative photosensitive resin composition is particularly suitable for use in production of an insulating organic film for organic EL, semiconductor packaging, or the like. Examples of active energy rays that may be used in patterning of a resin film formed using the presently disclosed negative photosensitive resin composition include, but are not specifically limited to, light rays such as ultraviolet rays, light rays of a single wavelength (for example, g-line, h-line, or i-line light rays), KrF excimer laser light, and ArF excimer laser light, and particle beams such as electron beams. The presently disclosed negative photosensitive resin composition is particularly suitable for use in a wavelength range of 200 nm to 500 nm, for example, from among the examples listed above.

(Negative Photosensitive Resin Composition)

The presently disclosed negative photosensitive resin composition is required to contain a polymer that includes structural units described below and a photo-radical generator, and can optionally contain a solvent and additive components. Through the presently disclosed negative photosensitive resin composition, it is possible to improve pattern formability by development and also to reduce the dielectric loss tangent of a resin film formed using the negative photosensitive resin composition and improve chemical resistance and extensibility of the resin film.

<Polymer>

The polymer contained in the presently disclosed negative photosensitive resin composition is a polymer including a functional group for which a cross-linking reaction can proceed through a radical generated upon irradiation with active energy rays in the presence of a photo-radical generator. The presently disclosed polymer includes a structural unit (I) represented by formula (I), shown below, and a structural unit (II) represented by formula (II), shown below. The polymer may also include structural units other than the structural unit (I) and the structural unit (II).

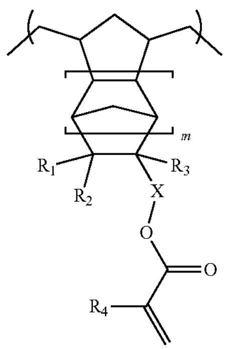

(I)

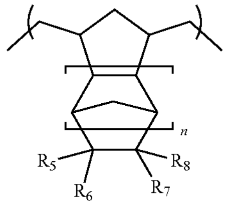

(II)

[Structural Unit (I)]

In the structural unit (I), $R_1$ to $R_3$ in formula (I) each represent, independently of one another, a hydrogen atom, an alkyl group, or an aromatic ring group, and $R_1$ to $R_3$ may be bonded to form a ring.

The alkyl group that can constitute $R_1$ to $R_3$ may be an unsubstituted alkyl group having a carbon number of 1 to 5, for example, without any specific limitations. In particular, the alkyl group that can constitute $R_1$ to $R_3$ is preferably a methyl group or an ethyl group.

The aromatic ring group that can constitute $R_1$ to $R_3$ may be an aromatic ring having a carbon number of 4 to 30, for example, without any specific limitations, and may be a benzene ring, a naphthalene ring, or the like, for example.

The ring formed through bonding of $R_1$ to $R_3$ may be a monocycle or a polycycle.

X in formula (I) represents an alkylene group having a carbon number of 1 to 10. The alkylene group having a carbon number of 1 to 10 that can constitute X is not specifically limited but is preferably a chain alkylene group having a carbon number of 1 to 6 such as a methylene group, an ethylene group, a propylene group, an n-butylene group, or an isobutylene group, more preferably a linear alkylene group having a carbon number of 1 to 6 such as a methylene group, an ethylene group, a propylene group, or an n-butylene group, even more preferably a linear alkylene group having a carbon number of 1 to 3 such as a methylene group, an ethylene group, or a propylene group, and particularly preferably a methylene group.

m in formula (I) indicates 0, 1, or 2, and is more preferably 0 or 1.

$R_4$ in formula (I) indicates a hydrogen atom or an alkyl group. The alkyl group that can constitute $R_4$ may be an unsubstituted alkyl group having a carbon number of 1 to 5, for example, without any specific limitations. In particular, the alkyl group that can constitute $R_4$ is preferably a methyl group or an ethyl group.

In the structural unit (I), a substituted or unsubstituted acryloyl group serving as a functional group is bonded to a cycloolefin structure via an alkylene group indicated by X as illustrated in formula (I), thereby increasing mobility of this functional group. Consequently, in a polymer that includes the structural unit (I) having a functional group such as described above, cross-linking reactivity of the functional group in the presence of a radical improves. For this reason, the presently disclosed negative photosensitive resin composition, which contains a photo-radical generator and a polymer including the structural unit (I) and the previously mentioned structural unit (II), can improve pattern formability by development and can also reduce the dielectric loss tangent of an obtained resin film and improve extensibility of the resin film.

The proportional content of the structural unit (I) in the polymer relative to 100 mol %, in total, of the structural unit (I) and the structural unit (II) is preferably 3 mol % or more, more preferably 10 mol % or more, and even more preferably 15 mol % or more, and is preferably 70 mol % or less, more preferably 50 mol % or less, and even more preferably 40 mol % or less. When the proportional content of the structural unit (I) in the polymer is within any of the ranges set forth above, extensibility of an obtained resin film is excellent. Moreover, chemical resistance of a resin film can be improved when the proportional content of the structural unit (I) in the polymer is not less than any of the lower limits set forth above, whereas an increase of the dielectric loss tangent of a resin film can be suppressed when the proportional content of the structural unit (I) in the polymer is not more than any of the upper limits set forth above.

[Structural Unit (II)]

In the structural unit (II), $R_5$ to $R_8$ in formula (II) each represent, independently of one another, a hydrogen atom, an alkyl group, or an aromatic ring group, and $R_4$ to $R_8$ may be bonded to form a ring.

The alkyl group that can constitute $R_4$ to $R_8$ may be any of the same alkyl groups as for the alkyl group that can constitute $R_1$ to $R_3$, for example, without any specific limitations.

The aromatic ring group that can constitute $R_4$ to $R_8$ may be any of the same aromatic ring groups as for the aromatic ring group that can constitute $R_1$ to $R_3$, for example, without any specific limitations.

The ring formed through bonding of $R_4$ to $R_8$ may be any of the same rings as for the ring formed through bonding of $R_1$ to $R_3$, for example, without any specific limitations.

In in formula (II) indicates 0, 1, or 2, and is preferably 0 or 1.

The proportional content of the structural unit (II) in the polymer relative to 100 mol %, in total, of the structural unit (I) and the structural unit (II) is preferably 3 mol % or more, more preferably 5 mol % or more, even more preferably 10 mol % or more, even more preferably 30 mol % or more, even more preferably 50 mol % or more, and particularly preferably 60 mol % or more, and is preferably 97 mol % or less, more preferably 90 mol % or less, and even more preferably 85 mol % or less.

[Properties of Polymer]

—Weight-Average Molecular Weight—

The weight-average molecular weight (Mw) of the polymer described above is preferably 3,000 or more, more preferably 5,000 or more, and even more preferably 10,000 or more, and is preferably 500,000 or less, more preferably 300,000 or less, and even more preferably 100,000 or less. When the weight-average molecular weight of the polymer is not less than any of the lower limits set forth above, mechanical characteristics can be improved. Moreover, when the weight-average molecular weight of the polymer is not more than any of the upper limits set forth above, solubility can be improved.

—Molecular Weight Distribution—

The molecular weight distribution (Mw/Mn) of the polymer described above is preferably 4 or less, more preferably 3 or less, and even more preferably 2 or less. When the molecular weight distribution of the polymer is not more than any of the upper limits set forth above, resolution can be improved. Note that the "molecular weight distribution (Mw/Mn)" referred to in the present disclosure is the ratio of the weight-average molecular weight (Mw) relative to the number-average molecular weight (Mn). Moreover, the weight-average molecular weight of the polymer referred to in the present disclosure can be determined as a polystyrene-equivalent value by gel permeation chromatography (GPC).

(Synthesis Method of Polymer)

No specific limitations are placed on the method by which the polymer described above is produced. For example, the polymer can be efficiently synthesized by a method including a step of synthesizing a ring-opened polymer through a ring-opening polymerization reaction of norbornene-based monomers and performing a hydrogenation reaction of the obtained ring-opened polymer (hereinafter, referred to as a "ring-opening polymerization step") and a step of performing a modification reaction of the obtained hydrogenated ring-opened polymer to obtain a modified product of the hydrogenated ring-opened polymer (hereinafter, referred to as a "modification step"). The following describes each step in detail.

<Ring-Opening Polymerization Step>

In the ring-opening polymerization step, a ring-opened polymer is first synthesized through a ring-opening polymerization reaction of a norbornene-based monomer (I) that can form the structural unit (I) described above and a norbornene-based monomer (II) that can form the structural unit (II) described above.

[Norbornene-Based Monomer (I)]

The norbornene-based monomer (I) may be 2-norbornene-5-methanol, 2-methyl-2-hydroxymethylbicyclo[2.2.1]hept-5-ene, 2,3-dihydroxymethylbicyclo[2.2.1]hept-5-ene, 3-hydroxytricyclo[$5.2.1.0^{2,6}$]deca-4,8-diene, 3-hydroxymethyltricyclo[$5.2.1.0^{2,6}$]deca-4,8-diene, 4-hydroxytetracyclo[$6.2.1.1^{3,6}.0^{2,7}$]dodec-9-ene, 4-hydroxymethyltetracyclo[$6.2.1.1^{3,6}.0^{2,7}$]dodec-9-ene, 4,5-dihydroxymethyltetracyclo[$6.2.1.1^{3,6}.0^{2,7}$]dodec-9-ene, or the like, for example. One norbornene-based monomer (I) can be used individually, or two or more norbornene-based monomers can be used in combination.

[Norbornene-Based Monomer (II)]

The norbornene-based monomer (II) may be tetracyclo[$4.4.0.1^{2,5}.1^{7,10}$]dodec-3-ene (commonly referred to as tetracyclododecene), 8-ethylidene-tetracyclo[$4.4.0.1^{2,5}.1^{7,10}$]dodec-3-ene (commonly referred to as ethylidene tetracyclododecene), tricyclo[$5.2.1.0^2$,6]deca-3,8-diene (commonly referred to as dicyclopentadiene), 1,4-methano-1,4,4a,9a-tetrahydrofluorene (commonly referred to as methanotetrahydrofluorene), 5-ethylidenebicyclo[2.2.1]

hept-2-ene (commonly referred to as ethylidene norbornene), bicyclo[2.2.1]hept-2-ene (also referred to as "norbornene"), 5-ethyl-bicyclo[2.2.1]hept-2-ene, 5-butyl-bicyclo[2.2.1]hept-2-ene, 5-methylidene-bicyclo[2.2.1]hept-2-ene, 5-vinyl-bicyclo[2.2.1]hept-2-ene, tetracyclo[10.2.1.$0^{2,11}$.$0^{4,9}$]pentadeca-4,6,8,13-tetraene, 9-methyl-tetracyclo[6.2.1.$1^{3,6}$.$0^{2,7}$]dodec-4-ene, 9-ethyl-tetracyclo[6.2.1.$1^{3,6}$.$0^{2,7}$]dodec-4-ene, 9-methylidene-tetracyclo[6.2.1.$1^{3,6}$.$0^{2,7}$]dodec-4-ene, 9-ethylidene-tetracyclo[6.2.1.$1^{3,6}$.$0^{2,7}$]dodec-4-ene, 9-vinyl-tetracyclo[6.2.1.$1^{3,6}$.$0^{2,7}$]dodec-4-ene, 9-propenyl-tetracyclo[6.2.1.$1^{3,6}$.$0^{2,7}$]dodec-4-ene, pentacyclo[9.2.1.$1^{3,9}$.$0^{2,10}$.$0^{4,8}$]pentadeca-5,12-diene, 9-phenyl-tetracyclo[6.2.1.$1^{3,6}$.$0^{2,7}$]dodec-4-ene, tetracyclo[9.2.1.$0^{2,10}$.$0^{3,8}$]tetradeca-3,5,7,12-tetraene, pentacyclo[9.2.1.$1^{3,9}$.$0^{2,10}$.$0^{4,8}$]pentadec-12-ene, a derivative of any thereof, or the like, for example. Note that the term derivative means that a substituent is included in a ring structure. Examples of substituents that can be included in the ring structure include an alkyl group, an alkylene group, a vinyl group, an alkoxycarbonyl group, and an alkylidene group. Moreover, the ring structure of the derivative may include one of these substituents or may include two or more of these substituents.

Furthermore, one norbornene-based monomer (II) can be used individually, or two or more norbornene-based monomers (II) can be used in combination.

The ring-opening polymerization reaction can be performed by a commonly known method in a solvent. The solvent that is used is not specifically limited and can be an organic solvent such as tetrahydrofuran or toluene, for example. Moreover, examples of molecular weight modifiers that may be used include ethylene; α-olefins having a carbon number of not less than 3 and not more than 20 such as propylene, 1-butene, 1-pentene, 1-hexene, 3-methyl-1-butene, 3-methyl-1-pentene, 3-ethyl-1-pentene, 4-methyl-1-pentene, 4-methyl-1-hexene, 4,4-dimethyl-1-hexene, 4,4-dimethyl-1-pentene, 4-ethyl-1-hexene, 3-ethyl-1-hexene, 1-octene, 1-decene, 1-dodecene, 1-tetradecene, 1-hexadecene, 1-octadecene, and 1-eicosene; and non-conjugated dienes such as 1,4-hexadiene, 1,5-hexadiene, 4-methyl-1,4-hexadiene, 5-methyl-1,4-hexadiene, and 1,7-octadiene and derivatives thereof. Furthermore, a metal catalyst that includes a metal such as molybdenum, tungsten, or ruthenium can be used as a ring-opening polymerization catalyst. Of these catalysts, a metal catalyst that includes ruthenium is preferable. The ring-opening polymerization time is normally not less than 1 hour and not more than 10 hours, and is preferably not less than 2 hours and not more than 5 hours. Moreover, the ring-opening polymerization temperature is normally not lower than 20° C. and not higher than 100° C., and is preferably 90° C. or lower.

The obtained ring-opened polymer is subsequently subjected to a hydrogenation reaction so as to synthesize a hydrogenated ring-opened polymer.

The hydrogenation reaction can be performed by a commonly known method. No specific limitations are placed on the hydrogenation reaction time, the hydrogenation reaction temperature, and the hydrogenation pressure in this hydrogenation reaction. However, the hydrogenation reaction time is normally not less than 1 hour and not more than 10 hours, and is preferably 5 hours or less. Moreover, the hydrogenation reaction temperature is normally not lower than 100° C. and not higher than 200° C., and is preferably 180° C. or lower. Furthermore, the hydrogenation pressure is normally not lower than 1 MPa and not higher than 10 MPa, and is preferably 5 MPa or lower.

<Modification Step>

In the modification step, a terminal part of the hydrogenated ring-opened polymer obtained in the ring-opening polymerization step is subjected to a modification reaction using a modifying agent so as to synthesize a modified product of the hydrogenated ring-opened polymer (i.e., synthesize a polymer including the structural unit (I) and the structural unit (II) described above). Examples of modifying agents that can be used include compounds that include a methacryloyl group or an acryloyl group. The compound including a methacryloyl group may be methacryloyl chloride, methacrylic anhydride, or the like, for example. The compound including an acryloyl group may be acryloyl chloride or acrylic anhydride, for example. Of these compounds, methacryloyl chloride or acryloyl chloride is more preferably used from a viewpoint of efficiently performing a modification reaction.

The modification reaction can be performed by causing the hydrogenated ring-opened polymer and the modifying agent to react in a solvent in the presence of a modification reaction catalyst, for example, but is not specifically limited to being performed in this manner. The modification reaction catalyst that is used can be triethylamine, pyridine, or the like, for example, without any specific limitations. Moreover, the solvent that is used can be any of the same types of solvents as the solvent used in the ring-opening polymerization reaction, for example, without any specific limitations. No specific limitations are placed on the modification reaction temperature and the modification reaction time. However, the modification reaction temperature is normally not lower than −10° C. and not higher than 15° C., and the modification reaction time is normally not less than 1 hour and not more than 15 hours.

<Photo-Radical Generator>

The photo-radical generator may be an acylphosphine oxide photo-radical generator, an oxime ester photo-radical generator, an aromatic ketone photo-radical generator, or the like. One photo-radical generator can be used, or two or more photo-radical generators can be used in combination. In particular, an acylphosphine oxide photo-radical generator or an oxime ester photo-radical generator is preferably used as the photo-radical generator from a viewpoint of further improving pattern formability by development and further reducing the dielectric loss tangent of an obtained resin film.

Examples of acylphosphine oxide photo-radical generators that can be used include bis(2,4,6-trimethylbenzoyl)phenylphosphine oxide, diphenyl(2,4,6-trimethylbenzoyl)phosphine oxide, and 2,4,6-trimethylbenzoylphenylethoxyphosphine oxide.

Examples of oxime ester photo-radical generators that can be used include 1,2-octanedione, 1-[4-(phenylthio)phenyl]-, 2-(o-benzoyl oxime); and ethanone, 1-[9-ethyl-6-(2-methylbenzoyl)-9H-carbazol-3-yl]-, 1-(O-acetyloxime).

Examples of aromatic ketone radical generators that can be used include benzophenone, 1-[4-(2-hydroxyethoxy)phenyl]-2-hydroxy-2-methyl-1-propan-1-one, 1-hydroxycyclohexyl phenyl ketone, 2,2-dimethoxy-1,2-diphenylethan-1-one, 2-benzyl-2-dimethylamino-1-(4-morpholinophenyl)butanone-1,2-hydroxy-2-methyl-1-phenyl-propan-1-one, 2-methyl-1-[4-(methylthio)phenyl]-2-morpholinopropan-1-one, methyl o-benzoylbenzoate, [4-(methylphenylthio)phenyl]phenylmethane, 1,4-dibenzoylbenzene, 2-benzoylnaphthalene, 4-benzoylbiphenyl, 4-benzoyldiphenyl ether, and benzil.

[Content of Photo-Radical Generator]

The content of the photo-radical generator is normally 0.3 parts by mass or more, preferably more than 0.5 parts by mass, and more preferably 1 part by mass or more per 100 parts by mass of the polymer, and is normally 25 parts by mass or less, preferably less than 20 parts by mass, more preferably 15 parts by mass or less, and even more preferably 10 parts by mass or less per 100 parts by mass of the polymer. When the content of the photo-radical generator is not less than any of the lower limits set forth above, even better pattern formability by development can be achieved because a cross-linking reaction of the functional group included in the structural unit (I) described above can be caused to sufficiently proceed. Moreover, when the content of the photo-radical generator is not more than any of the upper limits set forth above, the dielectric loss tangent of an obtained resin film can be even further reduced.

<Solvent>

Examples of solvents that can be contained in the presently disclosed negative photosensitive resin composition include, but are not specifically limited to, aromatic solvents such as toluene, o-xylene, m-xylene, p-xylene, 1,2,4-trimethylbenzene, 1,3,5-trimethylbenzene, and tetralin, hydrocarbons such as cyclohexane and decalin, ether solvents such as dibutyl ether, diisoamyl ether, tetrahydrofuran, and cyclopentyl methyl ether, ester solvents such as butyl acetate, hexyl acetate, and propylene glycol monomethyl ether acetate, and ketone solvents such as methyl ethyl ketone, diisobutyl ketone, and cyclopentanone. One of these solvents can be used individually, or two or more of these solvents can be used in combination.

The content of the solvent in the negative photosensitive resin composition is preferably an amount such that the total exclusive of the solvent is 10 mass % or more, and more preferably 20 mass % or more relative to the total mass of the negative photosensitive resin composition, and preferably 60 mass % or less, and more preferably 50 mass % or less relative to the total mass of the negative photosensitive resin composition.

<Additive Components>

Examples of additive components that can be contained in the presently disclosed negative photosensitive resin composition include, but are not specifically limited to, surfactants, antioxidants, sensitizers, adhesion aids, and so forth. One of these additive components can be used individually, or two or more of these additive components can be used in combination. In particular, the inclusion of a surfactant as an additive component is preferable from a viewpoint of improving coatability of the presently disclosed negative photosensitive resin composition and even further improving uniformity of film thickness of an obtained resin film.

Examples of surfactants that can be used include commonly known silicone surfactants, fluorinated surfactants, and the like without any specific limitations. The proportional content of the surfactant in the negative photosensitive resin composition is preferably 0.1 mass % or less, and more preferably 0.05 mass % or less relative to the total mass of the negative photosensitive resin composition.

<Production Method of Negative Photosensitive Resin Composition>

The presently disclosed negative photosensitive resin composition can be produced by mixing the essential components and the various optional components described above by a known method. The presently disclosed negative photosensitive resin composition may, for example, be used in the form of a negative photosensitive resin composition that is obtained when the components are dissolved in a solvent and then subjected to filtration. A known mixer such as a stirrer, a ball mill, a sand mill, a bead mill, a pigment disperser, a grinding machine, an ultrasonic disperser, a homogenizer, a planetary mixer, or a FILMIX may be used when dissolving the components in the solvent. Moreover, a typical filtration method using a filtration medium such as a filter may be adopted in the filtration.

<Production Method of Resin Film>

The presently disclosed negative photosensitive resin composition can be used to form a resin film by a known film formation method (for example, refer to WO2015/033901A1). Moreover, the obtained resin film may, without any specific limitations, be subjected to a photoexposure step of irradiation with any active energy rays (for example, photoexposure light having a wavelength of not less than 200 nm and not more than 500 nm) and a development step so as to form a resin film having a desired pattern. Moreover, a prebake step may be implemented before the photoexposure step or a post-exposure bake (PEB) step may be implemented at a desired timing after starting the photoexposure step, as necessary. Furthermore, a postbake step may be implemented after the end of the development step as necessary.

Note that no specific limitations are placed on the developer that is used in the aforementioned development step. For example, any of the solvents given as examples of solvents that can be contained in the presently disclosed negative photosensitive resin composition can be used as the developer. One of these developers can be used individually, or two or more of these developers can be used in combination.

EXAMPLES

The following provides a more specific description of the present disclosure based on examples. However, the present disclosure is not limited to the following examples. In the following description, "%" and "parts" used in expressing quantities are by mass, unless otherwise specified.

In the examples and comparative examples, the following methods were used to measure or evaluate dielectric loss tangent, remaining developed film fraction, chemical resistance, tensile elongation, and the weight-average molecular weight and molecular weight distribution of a polymer.

<Dielectric Loss Tangent>

A resin composition produced in each example or comparative example was spin coated onto a 4-inch silicon wafer on which an aluminum film of 50 nm in thickness had been formed using a sputtering apparatus (i-Miller CFS-4EP-LL produced by Shibaura Eletec Corporation) and was subsequently prebaked at 90° C. for 2 minutes using a hot plate to form a resin film formed of the resin composition. Next, photoexposure was performed with an irradiation dose of 1,000 mJ/cm$^2$ using a g-/h-/i-line mix in a mask aligner (PLA501F produced by Canon Inc.), and then 1 hour of heating was performed at 180° C. in nitrogen so as to cure the resin film and obtain a silicon wafer equipped with a resin film of 10 μm in thickness. The resin film-equipped silicon wafer that was obtained was then immersed in 0.1 mol % hydrochloric acid aqueous solution for 12 hours in order to perform etching of aluminum, and thereby strip the resin film from the silicon wafer. The resin film was dried in a 110° C. oven for 1 hour and then the dried resin film was cut to a strip shape of 2 mm in width and 50 mm in length to obtain a test specimen. This test specimen was used to measure the dielectric loss tangent at 10 GHz by the cavity resonator method.

A: Dielectric loss tangent of less than 0.0075

B: Dielectric loss tangent of not less than 0.0075 and less than 0.01

C: Dielectric loss tangent of 0.01 or more

<Remaining Developed Film Fraction>

A resin composition produced in each example or comparative example was applied onto a silicon wafer by spin coating and was subjected to 2 minutes of heated drying (prebaking) at 90° C. using a hot plate to form a resin film of 5.0 μm in thickness. Next, a mask aligner (PLA501F produced by Canon Inc.) was used to perform photoexposure with an irradiation dose of 1,000 mJ/cm$^2$ using a g-/h-/i-line mix, via a photomask having a 100 μm line-and-space pattern.

Toluene was then used as a developer to perform 60 seconds of development treatment, and then shake drying was performed to obtain a laminate that included a resin film having a line-and-space pattern and a silicon wafer. The film thickness of a line pattern section of the resin film after development treatment was measured using a spectroscopic film thickness measurement tool (Lambda Ace VM-1210 produced by Dainippon Screen Mfg. Co., Ltd.), and a remaining developed film fraction (%) was calculated by the following formula. A larger value for the remaining developed film fraction is preferable because it indicates better pattern formability by development.

Remaining developed film fraction (%)=(Film thickness of line pattern section of resin film after development treatment)/(Film thickness of resin film before development)×100

A: Remaining developed film fraction of 80% or more

B: Remaining developed film fraction of not less than 50% and less than 80%

C: Remaining developed film fraction of less than 50%

<Chemical Resistance>

A resin composition produced in each example or comparative example was spin coated onto a silicon wafer and was subsequently prebaked at 90° C. for 2 minutes using a hot plate to form a resin film formed of a resin composition film. Next, a mask aligner (PLA501F produced by Canon Inc.) was used to perform photoexposure with an irradiation dose of 1,000 mJ/cm$^2$ using a g-/h-/i-line mix, and then 1 hour of heating was performed at 180° C. in nitrogen so as to cure the resin film and obtain a silicon wafer equipped with a resin film of 10 μm in thickness.

The resin film-equipped silicon wafer that was obtained was immersed in a flux cleaner (HC-FX-50 produced by Tosoh Corporation) at 23° C. for 15 minutes, and the film thickness change was calculated by the following formula.

Film thickness change (%)=(Film thickness of resin film after immersion−Film thickness of resin film before immersion)/Film thickness before immersion×100

The chemical resistance of the resin film was evaluated in accordance with the following standard based on the value (%) calculated for the film thickness change. Absence of cracking and peeling of the film and a smaller film thickness change indicate that the resin film has better chemical resistance.

A: No cracking or peeling of film and film thickness change of less than 3%

B: No cracking or peeling of film and film thickness change of 3% or more

C: Cracking or peeling of film

<Tensile Elongation>

A resin composition produced in each example or comparative example was spin coated onto a 4-inch silicon wafer on which an aluminum film of 50 nm in thickness had been formed using a sputtering apparatus (i-Miller CFS-4EP-LL produced by Shibaura Eletec Corporation) and was subsequently prebaked at 90° C. for 2 minutes using a hot plate to form a resin film formed of the resin composition. Next, a mask aligner (PLA501F produced by Canon Inc.) was used to perform photoexposure with an irradiation dose of 1,000 mJ/cm$^2$ using a g-/h-/i-line mix. Next, 1 hour of heating was performed at 180° C. in nitrogen so as to cure the resin film and obtain a silicon wafer equipped with a resin film of 10 μm in thickness. The resin film-equipped silicon wafer that was obtained was then immersed in 0.1 mol % hydrochloric acid aqueous solution for 12 hours in order to perform etching of aluminum, and thereby strip the resin film from the resin film-equipped silicon wafer. The resin film was subsequently dried in a 110° C. oven for 1 hour.

The dried resin film was cut out as a strip shape of 5 mm in width and 40 mm in length to obtain a test specimen. This test specimen was used to perform a tensile test in order to measure the tensile elongation of the resin film. Specifically, a tensile test was performed by a tensile test machine (AGS-10kNX produced by Shimadzu Corporation) at 23° C. with a grip spacing of 20 mm and a tensing rate of 2 mm/min, and the elongation at the breaking point was measured. This test was performed for 8 test specimens, and an average value of the top 3 measurements was taken to be the tensile elongation of a resin film formed using the resin composition obtained in each example or comparative example. A larger value for the tensile elongation indicates that the resin film has higher extensibility. A higher resin film extensibility is preferable because this indicates that cracking or peeling is less likely to occur in a temperature cycle test or a drop impact test.

A: Tensile elongation of 10% or more

B: Tensile elongation of not less than 5% and less than 10%

C: Tensile elongation of less than 5%

<Weight-Average Molecular Weight and Molecular Weight Distribution>

The weight-average molecular weight (Mw) and number-average molecular weight (Mn) of a polymer obtained in each example or comparative example were measured by gel permeation chromatography, and then the molecular weight distribution (Mw/Mn) of the polymer was calculated.

Specifically, the weight-average molecular weight (Mw) and number-average molecular weight (Mn) of the polymer were determined as polystyrene-equivalent values using a gel permeation chromatograph (HLC-8220 produced by Tosoh Corporation) with tetrahydrofuran as an eluent solvent. The molecular weight distribution (Mw/Mn) was then calculated.

Synthesis Example 1

<Ring-Opening Polymerization Step>

A pressure-resistant reactor made of glass that had undergone purging with nitrogen was charged with 100 parts of a monomer mixture composed of 65 mol % of 2-norbornene-5-methanol (hereinafter, abbreviated as "NBMOH") as a norbornene-based monomer (I) and 35 mol % of tetracyclododecene (hereinafter, abbreviated as "TCD") as a norbornene-based monomer (II), 3.0 parts of 1,5-hexadiene as a molecular weight modifier, 0.025 parts of (1,3-dimesityl-imidazolin-2-ylidene)(tricyclohexylphosphine)benzylidene-ruthenium dichloride (synthesized by method described in Org. Lett., Vol. 1, p. 953, 1999), and 300 parts of tetrahydrofuran as a solvent. These materials were reacted at 80° C. for 4 hours under stirring to yield a polymerization reaction liquid.

The obtained polymerization reaction liquid was loaded into an autoclave and was subjected to a hydrogenation reaction at 150° C. and a hydrogen pressure of 4 MPa for 5 hours under stirring. Thereafter, 300 parts of tetrahydrofuran as a solvent was added to the reaction solution. This reaction solution was added dropwise to 8,000 parts of methanol to produce a precipitate that was then collected by filtration and dried under reduced pressure at 50° C. to yield a hydrogenated ring-opened polymer (A-1).

<Modification Step>

A three-necked flask having an impeller and a thermometer attached thereto was subjected to purging with nitrogen and was then charged with 100 parts of the hydrogenated ring-opened polymer (A-1), 336.5 parts of triethylamine as a modification reaction catalyst, and 400 parts of tetrahydrofuran as a solvent. The reaction solution was cooled to 0° C. in an ice bath. The temperature of the reaction solution was then held at 10° C. or lower while performing dropwise addition of 298.0 parts of methacryloyl chloride as a modifying agent and 2 hours of stirring. The temperature of the reaction solution was then raised to room temperature, and stirring was continued for 12 hours. Next, 200 parts of tetrahydrofuran as a solvent was added to the reaction solution. Thereafter, cooling was performed to 0° C., the temperature of the reaction solution was held at 10° C. or lower while adding methanol in a number of parts by mass corresponding to 0.5 times that of methacryloyl chloride, and stirring was performed at 0° C. for 1 hour and then at room temperature for 1 hour.

The reaction liquid was added dropwise to 8,000 parts of methanol to produce a precipitate that was then collected by filtration. The precipitate was washed three times with methanol and was subsequently dried under reduced pressure at 50° C. to yield a modified product of the hydrogenated ring-opened polymer (hereinafter, referred to as a "modified hydrogenated ring-opened polymer") (B-1). The modified hydrogenated ring-opened polymer (B-1) was determined to have a weight-average molecular weight of 14,600 and a molecular weight distribution of 1.7 by GPC measurement.

The methacryloyl modification rate of the hydrogenated ring-opened polymer (A-1) was confirmed to be 100% and the content of methacryloyl-modified NBMOH in the modified hydrogenated ring-opened polymer (B-1) was confirmed to be 65 mol % by $^{1}$H-NMR measurement. Moreover, the modified hydrogenated ring-opened polymer (B-1) was confirmed to be a polymer including 65 mol % of a structural unit represented by formula (I-1), shown below, and 35 mol % of a structural unit represented by formula (II-1), shown below.

(I-1)

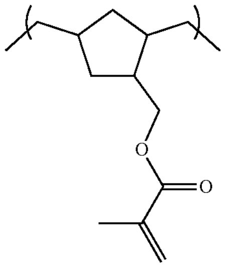

-continued (II-1)

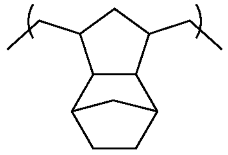

Synthesis Example 2

A hydrogenated ring-opened polymer (A-2) was obtained by performing the same operations as in Synthesis Example 1 with the exception that NBMOH was changed to 40 mol %, TCD was changed to 60 mol %, and the solvent was changed to toluene in Synthesis Example 1.

In addition, a modified hydrogenated ring-opened polymer (B-2) was obtained by performing the same operations as in Synthesis Example 1 with the exception that the hydrogenated ring-opened polymer (A-1) was changed to the hydrogenated ring-opened polymer (A-2), triethylamine was changed to 229.9 parts, methacryloyl chloride was changed to 176.2 parts, and the solvent was changed to toluene. The modified hydrogenated ring-opened polymer (B-2) was determined to have a weight-average molecular weight of 13,800 and a molecular weight distribution of 1.6 by GPC measurement.

The methacryloyl modification rate of the hydrogenated ring-opened polymer (A-2) was confirmed to be 100% and the content of methacryloyl-modified NBMOH in the modified hydrogenated ring-opened polymer (B-2) was confirmed to be 40 mol % by $^{1}$H-NMR measurement. Moreover, the modified hydrogenated ring-opened polymer (B-2) was confirmed to be a polymer including 40 mol % of a structural unit represented by formula (I-2), shown below, and 60 mol % of a structural unit represented by formula (II-2), shown below.

(I-2)

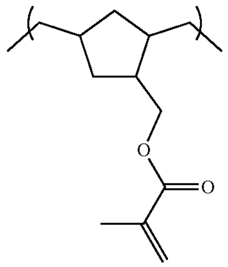

(II-2)

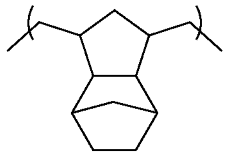

Synthesis Example 3

A hydrogenated ring-opened polymer (A-3) was obtained by performing the same operations as in Synthesis Example 1 with the exception that NBMOH was changed to 5 mol %, TCD was changed to 95 mol %, and the solvent was changed to toluene in Synthesis Example 1.

In addition, a modified hydrogenated ring-opened polymer (B-3) was obtained by performing the same operations as in Synthesis Example 1 with the exception that the hydrogenated ring-opened polymer (A-1) was changed to the hydrogenated ring-opened polymer (A-3), triethylamine was changed to 22.4 parts, methacryloyl chloride was changed to 19.8 parts, and the solvent was changed to toluene. The modified hydrogenated ring-opened polymer (B-3) was determined to have a weight-average molecular weight of 13,500 and a molecular weight distribution of 1.6 by GPC measurement.

The methacryloyl modification rate of the hydrogenated ring-opened polymer (A-3) was confirmed to be 100% and the content of methacryloyl-modified NBMOH in the modified hydrogenated ring-opened polymer (B-3) was confirmed to be 5 mol % by $^{1}$H-NMR measurement. Moreover, the modified hydrogenated ring-opened polymer (B-3) was confirmed to be a polymer including 5 mol % of a structural unit represented by formula (I-3), shown below, and 95 mol % of a structural unit represented by formula (II-3), shown below.

(I-3)

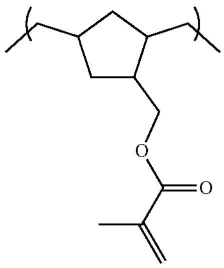

(II-3)

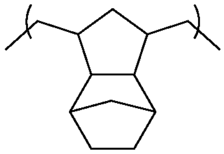

Synthesis Example 4

A hydrogenated ring-opened polymer (A-4) was obtained by performing the same operations as in Synthesis Example 1 with the exception that NBMOH was changed to 15 mol %, 90 mol % of TCD was changed to 85 mol % of ethylidene tetracyclododecene (hereinafter, abbreviated as "ETD"), and 3.0 parts of 1,5-hexadiene was changed to 1.0 parts in Synthesis Example 1.

In addition, a modified hydrogenated ring-opened polymer (B-4) was obtained by performing the same operations as in Synthesis Example 1 with the exception that the hydrogenated ring-opened polymer (A-1) was changed to the hydrogenated ring-opened polymer (A-4), triethylamine was changed to 60.0 parts, and methacryloyl chloride was changed to 53.2 parts. The modified hydrogenated ring-opened polymer (B-4) was determined to have a weight-average molecular weight of 29,000 and a molecular weight distribution of 1.4 by GPC measurement.

The methacryloyl modification rate of the hydrogenated ring-opened polymer (A-4) was confirmed to be 100% and the content of methacryloyl-modified NBMOH in the modified hydrogenated ring-opened polymer (B-4) was confirmed to be 15 mol % by $^{1}$H-NMR measurement. Moreover, the modified hydrogenated ring-opened polymer (B-4) was confirmed to be a polymer including 15 mol % of a structural unit represented by formula (I-4), shown below, and 85 mol % of a structural unit represented by formula (II-4), shown below.

(I-4)

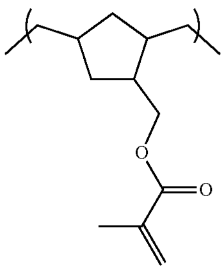

(II-4)

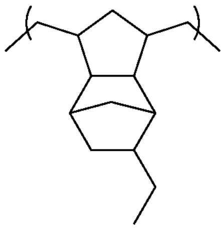

Synthesis Example 5

A hydrogenated ring-opened polymer (A-5) was obtained by performing the same operations as in Synthesis Example 1 with the exception that NBMOH was changed from 10 mol % to 30 mol % and 90 mol % of TCD was changed to 70 mol % of ETD in Synthesis Example 1.

In addition, a modified hydrogenated ring-opened polymer (B-5) was obtained by performing the same operations as in Synthesis Example 1 with the exception that the hydrogenated ring-opened polymer (A-1) was changed to the hydrogenated ring-opened polymer (A-5), triethylamine was changed to 126.4 parts, and methacryloyl chloride was changed to 111.2 parts. The modified hydrogenated ring-opened polymer (B-5) was determined to have a weight-average molecular weight of 14,700 and a molecular weight distribution of 1.7 by GPC measurement.

The methacryloyl modification rate of the hydrogenated ring-opened polymer (A-5) was confirmed to be 100% and the content of methacryloyl-modified NBMOH in the modified hydrogenated ring-opened polymer (B-5) was confirmed to be 30 mol % by $^{1}$H-NMR measurement. Moreover, the modified hydrogenated ring-opened polymer (B-5) was confirmed to be a polymer including 30 mol % of a structural unit represented by formula (I-5), shown below, and 70 mol % of a structural unit represented by formula (II-5), shown below.

(I-5)

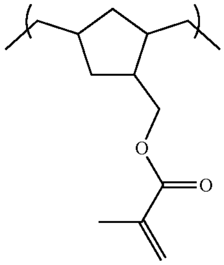

(II-5)

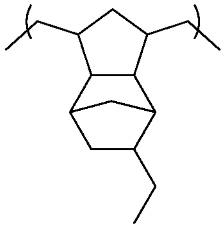

Synthesis Example 6

A hydrogenated ring-opened polymer (A-6) was obtained by performing the same operations as in Synthesis Example 1 with the exception that NBMOH was changed from 10 mol % to 25 mol %, 90 mol % of TCD was changed to 75 mol % of dicyclopentadiene, and the solvent was changed to toluene in Synthesis Example 1.

In addition, a modified hydrogenated ring-opened polymer (B-6) was obtained by performing the same operations as in Synthesis Example 1 with the exception that the hydrogenated ring-opened polymer (A-1) was changed to the hydrogenated ring-opened polymer (A-6), triethylamine was changed to 136.0 parts, methacryloyl chloride was changed to 120.4 parts, and the solvent was changed to toluene. The modified hydrogenated ring-opened polymer (B-6) was determined to have a weight-average molecular weight of 15,000 and a molecular weight distribution of 1.6 by GPC measurement.

The methacryloyl modification rate of the hydrogenated ring-opened polymer (A-6) was confirmed to be 100% and the content of methacryloyl-modified NBMOH in the modified hydrogenated ring-opened polymer (B-6) was confirmed to be 25 mol % by $^{1}$H-NMR measurement. Moreover, the modified hydrogenated ring-opened polymer (B-6) was confirmed to be a polymer including 25 mol % of a structural unit represented by formula (I-6), shown below, and 75 mol % of a structural unit represented by formula (II-6), shown below.

(I-6)

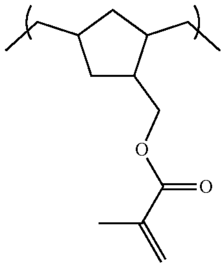

-continued (II-6)

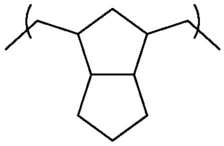

Synthesis Example 7

A hydrogenated ring-opened polymer (A-7) was obtained by performing the same operations as in Synthesis Example 1 with the exception that NBMOH was changed from 10 mol % to 35 mol % and 90 mol % of TCD was changed to 65 mol % of ETD in Synthesis Example 1.

In addition, a modified hydrogenated ring-opened polymer (B-7) was obtained by performing the same operations as in Synthesis Example 1 with the exception that the hydrogenated ring-opened polymer (A-1) was changed to the hydrogenated ring-opened polymer (A-7), triethylamine was changed to 136.0 parts, and methacryloyl chloride was changed to 120.4 parts of acryloyl chloride. The modified hydrogenated ring-opened polymer (B-7) was determined to have a weight-average molecular weight of 13,300 and a molecular weight distribution of 1.6 by GPC measurement.

The acryloyl modification rate of the hydrogenated ring-opened polymer (A-7) was confirmed to be 100% and the content of acryloyl-modified NBMOH in the modified hydrogenated ring-opened polymer (B-7) was confirmed to be 35 mol % by $^{1}$H-NMR measurement. Moreover, the modified hydrogenated ring-opened polymer (B-7) was confirmed to be a polymer including 35 mol % of a structural unit represented by formula (I-7), shown below, and 65 mol % of a structural unit represented by formula (II-7), shown below.

(I-7)

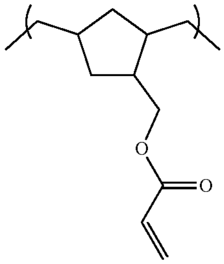

(II-7)

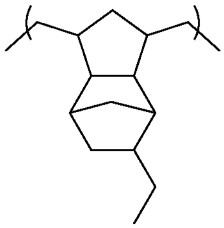

Synthesis Example 8

A hydrogenated ring-opened polymer (A-8) was obtained by performing the same operations as in Synthesis Example 1 with the exception that NBMOH was changed from 10 mol % to 40 mol % and 90 mol % of TCD was changed to 30 mol % of ethylidene norbornene (ENB) and 30 mol % of methanotetrahydrofluorene (MTF) in Synthesis Example 1.

In addition, a modified hydrogenated ring-opened polymer (B-8) was obtained by performing the same operations as in Synthesis Example 1 with the exception that the hydrogenated ring-opened polymer (A-1) was changed to the hydrogenated ring-opened polymer (A-8), triethylamine was changed to 201.8 parts, and methacryloyl chloride was changed to 154.7 parts. The modified hydrogenated ring-opened polymer (B-8) was determined to have a weight-average molecular weight of 14,100 and a molecular weight distribution of 1.7 by GPC measurement.

The methacryloyl modification rate of the hydrogenated ring-opened polymer (A-8) was confirmed to be 100% and the content of methacryloyl-modified NBMOH in the modified hydrogenated ring-opened polymer (B-8) was confirmed to be 40 mol % by $^1$H-NMR measurement. Moreover, the modified hydrogenated ring-opened polymer (B-8) was confirmed to be a polymer including 40 mol % of a structural unit represented by formula (I-8), shown below, 30 mol % of a structural unit represented by formula (II-8a), shown below, and 30 mol % of a structural unit represented by formula (II-8b), shown below.

(I-8)

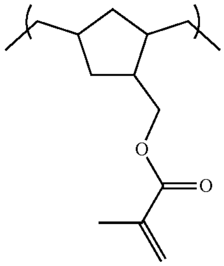

(II-8a)

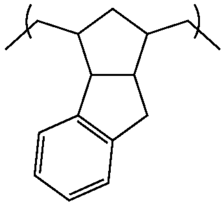

(II-8b)

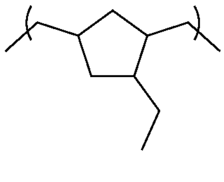

Synthesis Example 9

A hydrogenated ring-opened polymer (A-9) was obtained by performing the same operations as in Synthesis Example 1 with the exception that 10 mol % of NBMOH was changed to 40 mol % of norbornenol, TCD was changed from 90 mol % to 60 mol %, 3.0 parts of 1,5-hexadiene was changed to 1.0 parts, and the solvent was changed to toluene in Synthesis Example 1.

In addition, a modified hydrogenated ring-opened polymer (B-9) was obtained by performing the same operations as in Synthesis Example 1 with the exception that the hydrogenated ring-opened polymer (A-1) was changed to the hydrogenated ring-opened polymer (A-9), triethylamine was changed to 326.4 parts, methacryloyl chloride was changed to 250.3 parts, and the solvent was changed to toluene. The modified hydrogenated ring-opened polymer (B-9) was determined to have a weight-average molecular weight of 31,000 and a molecular weight distribution of 1.7 by GPC measurement.

The methacryloyl modification rate of the hydrogenated ring-opened polymer (A-9) was confirmed to be 100% and the content of methacryloyl-modified NBMOH in the modified hydrogenated ring-opened polymer (B-9) was confirmed to be 40 mol % by $^1$H-NMR measurement. Moreover, the modified hydrogenated ring-opened polymer (B-9) was confirmed to be a polymer including 40 mol % of a structural unit represented by formula (I-9), shown below, and 60 mol % of a structural unit represented by formula (II-9), shown below.

(I-9)

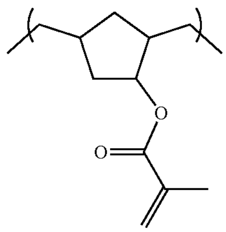

(II-9)

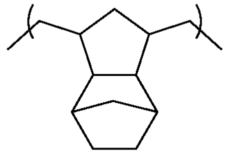

Synthesis Example 10

A norbornene/norbornene methanol copolymer was synthesized as an addition polymer (A-10) through an addition polymerization reaction of norbornene (NB) and NBMOH as norbornene-based monomers. Specifically, the NB/NBMOH copolymer was synthesized in accordance with a method described in Macromolecules 29, 2761 (1996) with the exception that the scale was increased by a factor of 20. The content of NBMOH in the NB/NBMOH copolymer was determined to be 15 mol % through $^1$H-NMR measurement.

A modified addition polymer (B-10) was then obtained by performing the same operations as in Synthesis Example 1 with the exception that the hydrogenated ring-opened polymer (A-1) was changed to the addition polymer (A-10), triethylamine was changed to 107.7 parts, methacryloyl chloride was changed to 82.6 parts, and the reaction solvent was changed to toluene.

The methacryloyl modification rate of the addition polymer (A-10) was confirmed to be 100% and the content of methacryloyl-modified NBMOH in the modified addition polymer (B-10) was confirmed to be 15 mol % by $^1$H-NMR measurement. The modified hydrogenated ring-opened polymer (B-9) was determined to have a weight-average molecular weight of 28,100 and a molecular weight distribution of 1.8 by GPC measurement. Moreover, the modified addition polymer (B-10) was confirmed to be a polymer including 15 mol % of a structural unit represented by formula (I-10), shown below, and 85 mol % of a structural unit represented by formula (II-10), shown below.

(I-10)

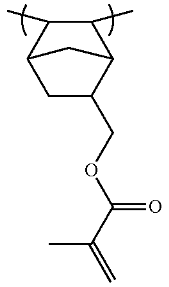

(II-10)

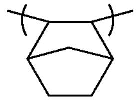

Example 1

<Production of Resin Composition>

Mixing was performed with respect to 100 parts of the modified hydrogenated ring-opened polymer (B-1) obtained in Synthesis Example 1, 5 parts of an oxime ester photo-radical generator (Irgacure OEX01 produced by BASF Corporation; chemical formula: 1,2-Octanedione, 1-[4-(phenylthio)phenyl]-, 2-(o-benzoyl oxime); hereinafter, referred to as "oxime ester radical generator (1)"), and toluene as a solvent (amount such that total exclusive of solvent was 30% relative to total mass of resin composition) so as cause dissolution. Next, a surfactant (KP-341 produced by Shin-Etsu Silicone; hereinafter, referred to as "surfactant (1)") was added in an amount such as to be 0.03% relative to the total amount of resin composition, and then filtration was performed using a filter made of polytetrafluoroethylene having a pore diameter of 0.45 μm (hereinafter, referred to as "filter (1)") to produce a resin composition. The obtained resin composition was used to perform various evaluations as previously described. The results are shown in Table 1.

Example 2

Mixing was performed with respect to 100 parts of the modified hydrogenated ring-opened polymer (B-2) obtained in Synthesis Example 2, 5 parts of the oxime ester photo-radical generator (1), and toluene as a solvent (amount such that total exclusive of solvent was 30% relative to total amount of resin composition) so as to cause dissolution. Next, the surfactant (1) was added in an amount such as to be 0.03% relative to the total amount of resin composition, and then filtration was performed using the filter (1) to produce a resin composition. The obtained resin composition was used to perform various evaluations as previously described. The results are shown in Table 1.

Example 3

Mixing was performed with respect to 100 parts of the modified hydrogenated ring-opened polymer (B-3) obtained in Synthesis Example 3, 5 parts of the oxime ester photo-radical generator (1), and toluene as a solvent (amount such that total exclusive of solvent was 30% relative to total amount of resin composition) so as to cause dissolution. Next, the surfactant (1) was added in an amount such as to be 0.03% relative to the total weight of resin composition, and then filtration was performed using the filter (1) to produce a resin composition. The obtained resin composition was used to perform various evaluations as previously described. The results are shown in Table 1.

Example 4

Mixing was performed with respect to 100 parts of the modified hydrogenated ring-opened polymer (B-4) obtained in Synthesis Example 4, 5 parts of an oxime ester photo-radical generator (Irgacure OEX02 produced by BASF Corporation; chemical formula: Ethanone, 1-[9-ethyl-6-(2-methylbenzoyl)-9H-carbazol-3-yl]-, 1-(O-acetyloxime); hereinafter, referred to as "oxime ester photo-radical generator (2)"), and toluene as a solvent (amount such that total exclusive of solvent was 30% relative to total amount of resin composition) so as to cause dissolution. Next, the surfactant (1) was added in an amount such as to be 0.03% relative to the total amount of resin composition, and then filtration was performed using the filter (1) to produce a resin composition. The obtained resin composition was used to perform various evaluations as previously described. The results are shown in Table 1.

Example 5

Mixing was performed with respect to 100 parts of the modified hydrogenated ring-opened polymer (B-5) obtained in Synthesis Example 5, 10 parts of an acylphosphine oxide photo-radical generator (Omnirad 819 produced by BASF Corporation; chemical formula: Bis(2,4,6-trimethylbenzoyl) phenylphosphine oxide), and toluene as a solvent (amount such that total exclusive of solvent was 30% relative to total amount of resin composition) so as to cause dissolution. Next, the surfactant (1) was added in an amount such as to be 0.03% relative to the total amount of resin composition, and then filtration was performed using the filter (1) to produce a resin composition. The obtained resin composition was used to perform various evaluations as previously described. The results are shown in Table 1.

Example 6

Mixing was performed with respect to 100 parts of the modified hydrogenated ring-opened polymer (B-5) obtained in Synthesis Example 5, 20 parts of the oxime ester photo-radical generator (1), and toluene as a solvent (amount such that total exclusive of solvent was 30% relative to total amount of resin composition) so as to cause dissolution. Next, the surfactant (1) was added in an amount such as to be 0.03% relative to the total amount of resin composition, and then filtration was performed using the filter (1) to produce a resin composition. The obtained resin composition was used to perform various evaluations as previously described. The results are shown in Table 1.

Example 7

Mixing was performed with respect to 100 parts of the modified hydrogenated ring-opened polymer (B-6) obtained in Synthesis Example 6, 5 parts of the oxime ester photo-radical generator (2), and toluene as a solvent (amount such that total exclusive of solvent was 30% relative to total amount of resin composition) so as to cause dissolution. Next, the surfactant (1) was added in an amount such as to be 0.03% relative to the total amount of resin composition, and then filtration was performed using the filter (1) to produce a resin composition. The obtained resin composition was used to perform various evaluations as previously described. The results are shown in Table 1.

Example 8

Mixing was performed with respect to 100 parts of the modified hydrogenated ring-opened polymer (B-6) obtained in Synthesis Example 6, 0.5 parts of the oxime ester photo-radical generator (2), and toluene as a solvent (amount such that total exclusive of solvent was 30% relative to total amount of resin composition) so as to cause dissolution. Next, the surfactant (1) was added in an amount such as to be 0.03% relative to the total amount of resin composition, and then filtration was performed using the filter (1) to produce a resin composition. The obtained resin composition was used to perform various evaluations as previously described. The results are shown in Table 1.

Example 9

Mixing was performed with respect to 100 parts of the modified hydrogenated ring-opened polymer (B-7) obtained in Synthesis Example 7, 3 parts of the oxime ester photo-radical generator (1), and toluene as a solvent (amount such that total exclusive of solvent was 30% relative to total amount of resin composition) so as to cause dissolution. Next, the surfactant (1) was added in an amount such as to be 0.03% relative to the total amount of resin composition, and then filtration was performed using the filter (1) to produce a resin composition. The obtained resin composition was used to perform various evaluations as previously described. The results are shown in Table 1.

Example 10

Mixing was performed with respect to 100 parts of the modified hydrogenated ring-opened polymer (B-2) obtained in Synthesis Example 2, 5 parts of benzophenone as an aromatic ketone photo-radical generator, and toluene as a solvent (amount such that total exclusive of solvent was 30% relative to total amount of resin composition) so as to cause dissolution. Next, the surfactant (1) was added in an amount such as to be 0.03% relative to the total amount of resin composition, and then filtration was performed using the filter (1) to produce a resin composition. The obtained resin composition was used to perform various evaluations as previously described. The results are shown in Table 1.

Example 11

Mixing was performed with respect to 100 parts of the modified hydrogenated ring-opened polymer (B-8) obtained in Synthesis Example 8, 5 parts of the oxime ester photo-radical generator (2), and toluene as a solvent (amount such that total exclusive of solvent was 30% relative to total amount of resin composition) so as to cause dissolution. Next, the surfactant (1) was added in an amount such as to be 0.03% relative to the total amount of resin composition, and then filtration was performed using the filter (1) to produce a resin composition.

The obtained resin composition was used to perform various evaluations as previously described. The results are shown in Table 1.

Comparative Example 1

Mixing was performed with respect to 100 parts of the modified hydrogenated ring-opened polymer (B-9) obtained in Synthesis Example 9, 10 parts of the acylphosphine oxide photo-radical generator used in Example 5, and toluene as a solvent (amount such that total exclusive of solvent was 30% relative to total amount of resin composition) so as to cause dissolution. Next, the surfactant (1) was added in an amount such as to be 0.03% relative to the total amount of resin composition, and then filtration was performed using the filter (1) to produce a resin composition. The obtained resin composition was used to perform various evaluations as previously described. The results are shown in Table 1.

Comparative Example 2

Mixing was performed with respect to 100 parts of the modified hydrogenated ring-opened polymer (B-2) obtained in Synthesis Example 2, 10 parts of dicumyl peroxide (peroxide thermal radical generator) as a thermal radical generator, and toluene as a solvent (amount such that total exclusive of solvent was 30% relative to total amount of resin composition) so as to cause dissolution. Next, the surfactant (1) was added in an amount such as to be 0.03% relative to the total amount of resin composition, and then filtration was performed using the filter (1) to produce a resin composition. The obtained resin composition was used to perform various evaluations as previously described. The results are shown in Table 1.

Comparative Example 3

Mixing was performed with respect to 100 parts of the modified addition polymer (B-10) obtained in Synthesis Example 10, 5 parts of the oxime ester photo-radical generator (1), and toluene as a solvent (amount such that total exclusive of solvent was 30% relative to total amount of resin composition) so as to cause dissolution. Next, the surfactant (1) was added in an amount such as to be 0.03% relative to the total amount of resin composition, and then filtration was performed using the filter (1) to produce a resin composition. The obtained resin composition was used to perform various evaluations as previously described. The results are shown in Table 1.

TABLE 1

| | | | | Example 1 | Example 2 | Example 3 | Example 4 | Example 5 | Example 6 | Example 7 |
|---|---|---|---|---|---|---|---|---|---|---|
| Resin composition | Polymer | Type | | B-1 | B-2 | B-3 | B-4 | B-5 | B-5 | B-6 |
| | | Content [parts by mass] | | 100 | 100 | 100 | 100 | 100 | 100 | 100 |
| | | Proportional content of structural unit having functional group in polymer [mol %] | | 65 | 40 | 5 | 15 | 30 | 30 | 25 |
| | Radical generator | Photo-radical generator | Oxime ester (1) [parts by mass] | 5 | 5 | 5 | — | — | 20 | — |
| | | | Oxime ester (2) [parts by mass] | — | — | — | 5 | — | — | 5 |

TABLE 1-continued

| | | | | | | | | | |
|---|---|---|---|---|---|---|---|---|---|
| | | Acylphosphine oxide [parts by mass] | — | — | — | — | 10 | — | — |
| | | Aromatic ketone [parts by mass] | — | — | — | — | — | — | — |
| | Thermal radical generator | Peroxide [parts by mass] | — | — | — | — | — | — | — |
| Evaluation | | Dielectric loss tangent | B | A | A | A | A | B | A |
| | | Remaining developed film fraction | A | A | C | A | A | A | A |
| | | Chemical resistance | A | A | B | A | A | A | A |
| | | Tensile elongation | B | A | B | A | A | A | A |

| | | | | Example 8 | Example 9 | Example 10 | Example 11 | Comparative Example 1 | Comparative Example 2 | Comparative Example 3 |
|---|---|---|---|---|---|---|---|---|---|---|
| Resin composition | Polymer | | Type | B-6 | B-7 | B-2 | B-8 | B-9 | B-2 | B-10 |
| | | | Content [parts by mass] | 100 | 100 | 100 | 100 | 100 | 100 | 100 |
| | | | Proportional content of structural unit having functional group in polymer [mol %] | 25 | 35 | 40 | 40 | 40 | 40 | 15 |
| | Radical generator | Photo-radical generator | Oxime ester (1) [parts by mass] | — | 3 | — | — | — | — | 5 |
| | | | Oxime ester (2) [parts by mass] | 0.5 | — | — | 5 | — | — | — |
| | | | Acylphosphine oxide [parts by mass] | — | — | — | — | 10 | — | — |
| | | | Aromatic ketone [parts by mass] | — | — | 5 | — | — | — | — |
| | | Thermal radical generator | Peroxide [parts by mass] | — | — | — | — | — | 10 | — |
| Evaluation | | | Dielectric loss tangent | A | A | A | A | A | C | B |
| | | | Remaining developed film fraction | B | A | C | A | C | C | B |
| | | | Chemical resistance | A | A | A | A | A | A | C |
| | | | Tensile elongation | A | A | A | A | C | A | C |

It can be seen from Table 1 that the resin compositions (negative photosensitive resin compositions) of Examples 1 to 11, which each contain a polymer including specific structural units and a photo-radical generator, excel in terms of each of dielectric loss tangent, remaining developed film fraction, chemical resistance, and tensile elongation.

In contrast, it can be seen that it was not possible to increase both the remaining developed film fraction and tensile elongation with the resin composition of Comparative Example 1 in which a polymer including a structural unit having a functional group was used, but in which the polymer had a structure in which the functional group was bonded directly to a hydrogenated ring-opened polymer.

It can also be seen that it was not possible to reduce the dielectric loss tangent and to increase the remaining developed film fraction with the resin composition of Comparative Example 2 in which a thermal radical generator was used as a radical generator.

It can also be seen that it was not possible to increase both chemical resistance and tensile elongation with the resin composition of Comparative Example 3 in which a modified addition polymer was used.

INDUSTRIAL APPLICABILITY

According to the present disclosure, it is possible to provide a negative photosensitive resin composition that can improve pattern formability by development and that can also reduce the dielectric loss tangent of an obtained resin film and improve chemical resistance and extensibility of the resin film.

The invention claimed is:

1. A negative photosensitive resin composition comprising:
   - a polymer; and
   - a photo-radical generator, wherein
   - the polymer includes a structural unit (I) represented by formula (I), shown below, and a structural unit (II) represented by formula (II), shown below, (I)

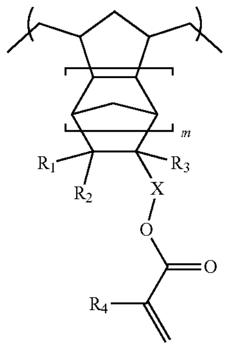

(II)

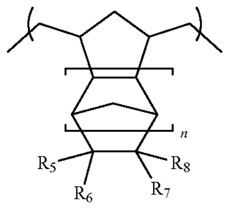

where, in formula (I), $R_1$ to $R_3$ each indicate, independently of one another, a hydrogen atom, an alkyl group, or an aromatic ring group, $R_1$ to $R_3$ may be bonded to form a ring, $R_4$ indicates a hydrogen atom or an alkyl group, X indicates an alkylene group having a carbon number of 1 to 10, and m indicates 0, 1, or 2, and in formula (II), $R_5$ to $R_8$ each indicate, independently of one another, a hydrogen atom, an alkyl group, or an aromatic ring group, $R_5$ to $R_8$ may be bonded to form a ring, and n indicates 0, 1, or 2.

2. The negative photosensitive resin composition according to claim 1, wherein the photo-radical generator is an acylphosphine oxide photo-radical generator or an oxime ester photo-radical generator.

3. The negative photosensitive resin composition according to claim 1, wherein content of the photo-radical generator is more than 0.5 parts by mass and not more than 25 parts by mass per 100 parts by mass of the polymer.

4. The negative photosensitive resin composition according to claim 1, wherein proportional content of the structural unit (I) in the polymer is not less than 3 mol % and not more than 70 mol %.

* * * * *